United States Patent
Kim et al.

(10) Patent No.: US 11,569,109 B2
(45) Date of Patent: Jan. 31, 2023

(54) WAFER CASSETTE STOCKER AND WAFER CASSETTE DRYING METHOD USING THE SAME

(71) Applicant: SK SILTRON CO., LTD., Gumi-si (KR)

(72) Inventors: Dae Won Kim, Gumi-si (KR); Jong Joo Lee, Gumi-si (KR)

(73) Assignee: SK SILTRON CO., LTD., Gumi-Si (KR)

( * ) Notice: Subject to any disclaimer, the term of this patent is extended or adjusted under 35 U.S.C. 154(b) by 112 days.

(21) Appl. No.: 17/054,255

(22) PCT Filed: Nov. 26, 2018

(86) PCT No.: PCT/KR2018/014598
§ 371 (c)(1),
(2) Date: Nov. 10, 2020

(87) PCT Pub. No.: WO2019/225821
PCT Pub. Date: Nov. 28, 2019

(65) Prior Publication Data
US 2021/0074565 A1    Mar. 11, 2021

(30) Foreign Application Priority Data

May 25, 2018  (KR) ........................ 10-2018-0059590

(51) Int. Cl.
*H01L 21/67*   (2006.01)
*H01L 21/673*  (2006.01)
*H01L 21/677*  (2006.01)

(52) U.S. Cl.
CPC ...... *H01L 21/67379* (2013.01); *H01L 21/677* (2013.01); *H01L 21/67393* (2013.01)

(58) Field of Classification Search
CPC combination set(s) only.
See application file for complete search history.

(56) References Cited

U.S. PATENT DOCUMENTS 5,879,458 A * 3/1999 Roberson, Jr. .... H01L 21/67769
                                                    414/217
2010/0221993 A1   9/2010 Ellwanger

FOREIGN PATENT DOCUMENTS

| JP | H06-069180     |   | 3/1994  |             |
|----|----------------|---|---------|-------------|
| JP | H10158659      | * | 6/1998  | ... C10B 57/10 |
| JP | 2911964        |   | 6/1999  |             |
| KR | 10-1998-0076511|   | 11/1998 |             |
| KR | 10-2000-0065515|   | 11/2000 |             |
| KR | 10-2003-0007014|   | 1/2003  |             |
| KR | 10-0524875     |   | 10/2005 |             |
| KR | 10-0687161     |   | 2/2007  |             |

(Continued)

OTHER PUBLICATIONS

International Search Report dated Feb. 26, 2019 issued in Application No. PCT/KR2018/014598.

*Primary Examiner* — Ronald P Jarrett
(74) *Attorney, Agent, or Firm* — KED & Associates, LLP (57) ABSTRACT

An embodiment provides a wafer cassette stoker comprising: a cassette on which a plurality of wafers are loaded; a plurality of chambers disposed in one line while forming at least one layer, wherein the cassette after being cleaned is inserted in each of the chambers and a humidity control unit for supplying a compressed dry air (CDA) into the insides of the chambers so as to control humidity of the cassette.

9 Claims, 7 Drawing Sheets

(56) References Cited

FOREIGN PATENT DOCUMENTS

| KR | 10-2008-0009568 | 1/2008 |
|---|---|---|
| KR | 10-1176715 | 8/2012 |

* cited by examiner

WAFER CASSETTE STOCKER AND WAFER CASSETTE DRYING METHOD USING THE SAME

CROSS-REFERENCE TO RELATED PATENT APPLICATIONS

This application is a U.S. National Stage Application under 35 U.S.C. § 371 of PCT Application No. PCT/KR2018/014598, filed Nov. 26, 2018, which claims priority to Korean Patent Application No. 10-2018-0059590, filed May 25, 2018, whose entire disclosures are hereby incorporated by reference.

TECHNICAL FIELD

The present invention relates to a wafer cassette stocker, and more particularly to a wafer cassette stocker capable of drying a cleaned wafer cassette and a wafer cassette drying method using the same.

BACKGROUND ART

A silicon wafer may be contaminated at a surface thereof by various contaminants in a procedure in which a semiconductor process such as light exposure, deposition, etching, or the like is performed.

In order to avoid such contamination and to achieve an enhancement in process speed, a plurality of silicon wafers may be moved during a wafer manufacturing process or a semiconductor process under the condition that the silicon wafers are stacked in a wafer cassette, or may be shipped under the condition that the silicon wafers are packed in a cassette in a stacked state.

Generally, a wafer, which is widely used as a material for manufacture of semiconductor devices, means a monocrystalline silicon thin plate made using polycrystalline silicon as a raw material thereof.

Such a wafer is manufactured through a slicing process of growing polycrystalline silicon into a monocrystalline silicon ingot, and then cutting the silicon ingot in the form of a wafer, a lapping process of planarizing the wafer through uniformity of the thickness of the wafer, an etching process of removing or alleviating damage caused by mechanical grinding, a polishing process of polishing a surface of the wafer, a cleaning process of cleaning the wafer, etc. Such a wafer is then shipped in a state of being packed in a wafer cassette.

Such a wafer cassette may be classified into two kinds, that is, a front open unified pod (FOUP) and a front opening shipping box (FOSB). Such a wafer cassette may also be referred to as a "wafer carrier".

In the FOUP, a plurality of wafers is horizontally stacked. The FOUP is constituted by a FOUP cell and a FOUP door. The FOUP is used to be directly put into a production process.

The FOSB is used for a shipping purpose to store or move wafers. The FOSB has a structure substantially similar to that of the FOUP. The FOSB exhibits excellent sealing characteristics for wafers, and has a feature in that a separate auxiliary device such as a carrier box is unnecessary.

Meanwhile, such a wafer cassette is used under the condition that the wafer cassette is on standby in a wafer cassette stocker after removal of contaminants present therein through a cleaning process using deionized water (DIW) and a drying process. In this case, when residual moisture is present in the wafer cassette (for example, an FOSB), haze contamination in which surfaces of wafers stacked in the cassette become hazy due to the residual moisture with passage of time, that is, time-dependent haze (also referred to as "TDH"), may occur in the wafers.

The FOSB is mainly made of polycarbonate (PC). However, this material is a material having high moisture absorption and, as such, may generate the above-mentioned TDH phenomenon in accordance with humidity in the interior of the FOSB.

DISCLOSURE

Technical Problem

Therefore, the present invention is adapted to provide a wafer cassette stocker including a drying function capable of avoiding occurrence of a time-dependent haze (TDH) phenomenon through removal of moisture from a wafer cassette stored in a stocker, and a wafer cassette drying method using the same.

Technical Solution

The present invention provides a wafer cassette stocker including cassettes each capable of stocking a plurality of wafers therein, a plurality of chambers disposed in a line while forming at least one story, the chambers receiving the cassettes therein after cleaning of the cassettes, and a humidity controller for supplying compressed dry air (CDA) to interiors of the chambers, thereby controlling humidity of the cassettes.

The humidity controller may include a compressed air generator for generating the compressed dry air, supply lines for connecting the compressed air generator to an upper side of the chambers, and a discharge line connected to a lower side of the chambers.

The humidity controller may further include a heater installed between the supply lines.

The humidity controller may further include an upper panel formed with a plurality of through holes to guide compressed dry air introduced therein from the supply lines to flow toward a lower side of the cassettes, the upper panel being disposed at an inner upper side of the chambers.

The humidity controller may further include a lower panel formed with a plurality of through holes to guide the compressed dry air to flow toward the discharge line, the lower panel being disposed at an inner lower side of the chambers to support the cassettes.

The plurality of through holes formed at the upper panel and the lower panel may be disposed to have sizes such that areas of the through holes gradually increase with increasing distance from the supply lines or the discharge line.

The humidity controller may further include at least one of a thermometer and a hygrometer installed within the chambers.

Meanwhile, the present invention provides wafer cassette stocker including a stocker comprising a first chamber, and a second chamber disposed over the first chamber, a first cassette received in the first chamber, a second cassette received in the second chamber, a central panel installed within the stocker to partition the first chamber and the second chamber while supporting the second cassette, the central panel being formed with a plurality of central through holes, and a humidity controller for supplying compressed dry air to an interior of the stocker, thereby removing moisture of the first cassette and the second cassette.

The humidity controller may include a compressed air generator for generating the compressed dry air, supply lines for connecting the compressed air generator to an upper side of the first chamber, a discharge line connected to a lower side of the second chamber, and a heater installed between the supply lines.

The humidity controller may further include an upper panel formed with a plurality of through holes to guide compressed dry air introduced therein from the supply lines to flow therethrough, the upper panel being disposed at an inner upper side of the first chamber, and a lower panel formed with a plurality of through holes to guide the compressed dry air to flow toward the discharge line, the lower panel being disposed at an inner lower side of the second chamber to support the first cassette.

The plurality of through holes formed at the upper panel and the lower panel may be disposed to have sizes such that areas of the through holes gradually increase with increasing distance from the supply lines or the discharge line.

The central through holes formed at the central panel may have the same size.

The humidity controller may further include at least one of a thermometer and a hygrometer installed at the stocker or the chambers.

Meanwhile, the present invention provides a wafer cassette drying method including inserting a cassette into a chamber, compressed dry air circulation of supplying compressed dry air to an interior of the chamber such that the supplied compressed dry air is discharged to an outside of the chamber after circulating the cassette, temperature measurement of measuring an internal temperature of the chamber, temperature comparison of comparing whether or not a temperature measured in the temperature measurement is lower than a predetermined temperature, and heater operation of operating a heater when the measured temperature is lower than the predetermined temperature in accordance with results of the temperature comparison.

The wafer cassette drying method may further include heater stop of stopping operation of the heater when the measured temperature in the temperature comparison is higher than the predetermined temperature.

Time measurement of measuring a time for which the compressed dry air is supplied may be performed after the heater operation or the heater stop.

The wafer cassette drying method may further include stabilization determination of determining whether or not the time measured in the time measurement corresponds to a time for which stabilization proceeds in an interior of the cassette.

When the measured time in the stabilization determination corresponds to the stabilization proceeding time, the heater stop may be performed, whereas, when the measured time in the stabilization determination does not correspond to the stabilization proceeding time, the temperature measurement may be performed.

The wafer cassette drying method may further include humidity measurement of measuring internal humidity of the chamber.

When the measured humidity in the humidity measurement is higher than a predetermined humidity, the heater operation may be performed, whereas, when the measured humidity in the humidity measurement is lower than the predetermined humidity, the heater stop may be performed.

Meanwhile, the present invention provides a wafer cassette drying method including inserting a cassette into a chamber, compressed dry air circulation of supplying compressed dry air to an interior of the chamber such that the supplied compressed dry air is discharged to an outside of the chamber after circulating the cassette, humidity measurement of measuring internal humidity of the chamber, humidity comparison of comparing whether or not humidity measured in the humidity measurement is higher than predetermined humidity, and heater operation of operating a heater when the measured humidity is higher than the predetermined humidity in accordance with results of the humidity comparison.

Advantageous Effects

In accordance with the wafer cassette stocker of the present invention and the wafer cassette drying method of the present invention using the same, moisture of a wafer cassette is removed through supply of compressed dry air at a high temperature to the interior of a chamber and, as such, it may be possible to avoid occurrence of a time-dependent haze (TDH) phenomenon, and to maintain a suitable environment in the interior of the cassette.

BEST MODE

Hereinafter, embodiments will be apparent from the accompanying drawings and description of embodiments. In the description of embodiments, it will be understood that, when an element such as a layer (film), a region, a pattern, or a structure is referred to as being "on" or "under" another element such as a substrate, each layer (film), a region, a pad or a pattern, it can be directly on or under another element or can be indirectly formed such that an intervening element is also present. In addition, terms such as "on" or "under" should be understood on the basis of the drawings.

In the drawings, dimensions of layers are exaggerated, omitted, or schematically illustrated for clarity and convenience of description. In addition, dimensions of constituent elements do not entirely reflect actual dimensions thereof. Throughout description of the drawings, the same reference numerals denote the same constituent elements. Hereinafter, embodiments will be described with reference to the accompanying drawings.

Figure 1:
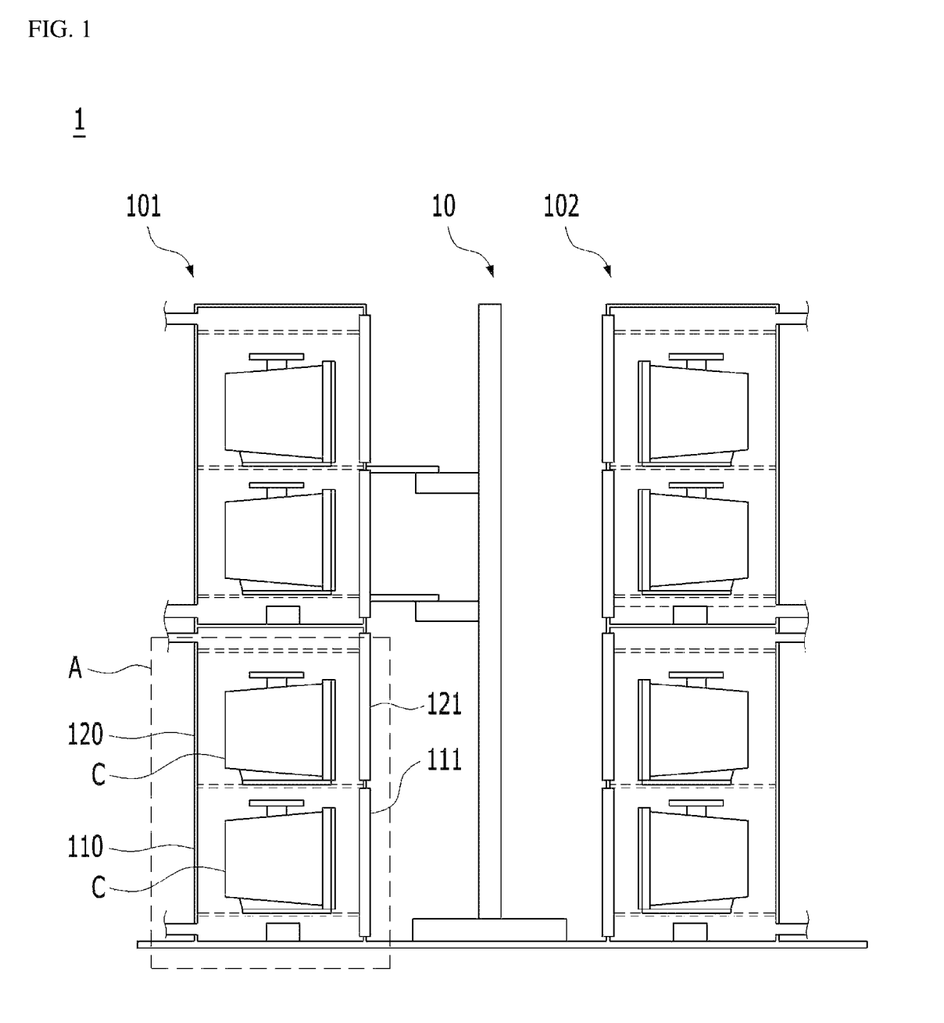
FIG. 1 is a schematic side view of a wafer cassette stocker according to an embodiment.
Figure 2:
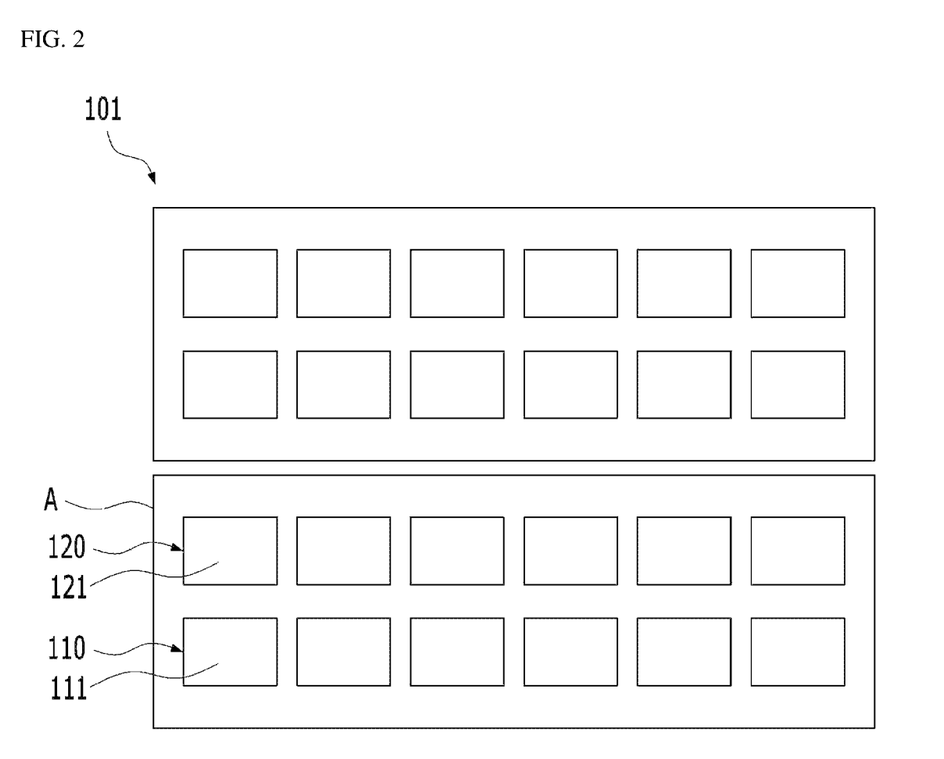
FIG. 2 is a schematic front view of a first shelf in FIG. 1.

FIG. 1 is a schematic side view of a wafer cassette stocker according to an embodiment. FIG. 2 is a schematic front view of a first shelf in FIG. 1.

As shown in FIGS. 1 and 2, a wafer cassette stocker 1 according to an embodiment may include a first shelf 101, a second shelf 102, and a rack master 10, which face one another. Here, the first shelf 101 and the second shelf 102 may also be referred to as a "first shelf" and a "second shelf", respectively.

Each of the first shelf 101 and the second shelf 102 includes a chamber into which a plurality of cassettes C may be inserted to be individually stored. Each of the first shelf 101 and the second shelf 102 may include a function of drying moisture of the cassettes C and, as such, may provide a suitable environment for wafers stacked in the cassettes C through adjustment of internal humidity and internal temperature of the chamber thereof. This will be described later.

The rack master 10 may be disposed between the first shelf 101 and the second shelf 102, and may insert cassettes C into chambers 110 and 120 or may eject the cassettes C from the chambers 110 and 120 while moving along stories and columns of the first shelf 101 and the second shelf 102.

Each cassette C may store a plurality of wafers (not shown) in a stacked state. The cassette C may also be referred to as a "wafer carrier". For example, the cassette C may be a front opening shipping box (FOSB).

The first shelf 101 and the second shelf 102 may be configured to have the same shape, and may be disposed to face each other. Accordingly, for convenience of description, only the configuration of the first shelf 101 will be representatively described.

The first shelf 101 includes a plurality of chambers 110 and 120 into which cassettes C each capable of stacking a plurality of wafers therein may be inserted, respectively. For example, the plurality of chambers 110 and 120 form at least one story, and may be disposed in a line within the first shelf 101.

In an embodiment, as shown in FIGS. 1 and 2, the first shelf 101 is illustrated as having a structure in which chambers are stacked such that cassettes C form four stories, and 6 chambers are disposed at each story. However, the first shelf may be variously variable without being limited to the above-described structure.

Each of the chambers 110 and 120 may have a hexahedral shape, and a cassette C may be received and laid therein. Doors 111 and 121, which can be opened/closed, may be installed at the chambers 110 and 120, respectively. The shapes, door positions, and sizes of the chambers 110 and 120 may be variable.

Each chamber may have an independent space partitioned from other chambers. However, as in the embodiment shown in FIG. 1, the first chamber 110 positioned at a lower side and the second chamber 120 positioned at an upper side may be disposed adjacent to each other to have a space through which the first chamber 110 and the second chamber 120 communicate with each other.

For example, as in a region A shown in FIG. 1, the first chamber 110 and the second chamber 120 may be configured to have modular structures such that the first chamber 110 and the second chamber 120 communicate with each other at upper and lower sides thereof. The first door 111 and the second door 121 are installed in an individual manner at the first chamber 110 and the second chamber 120 such that inner spaces of the first chamber 110 and the second chamber 120 can be opened/closed, respectively.

Figure 3:
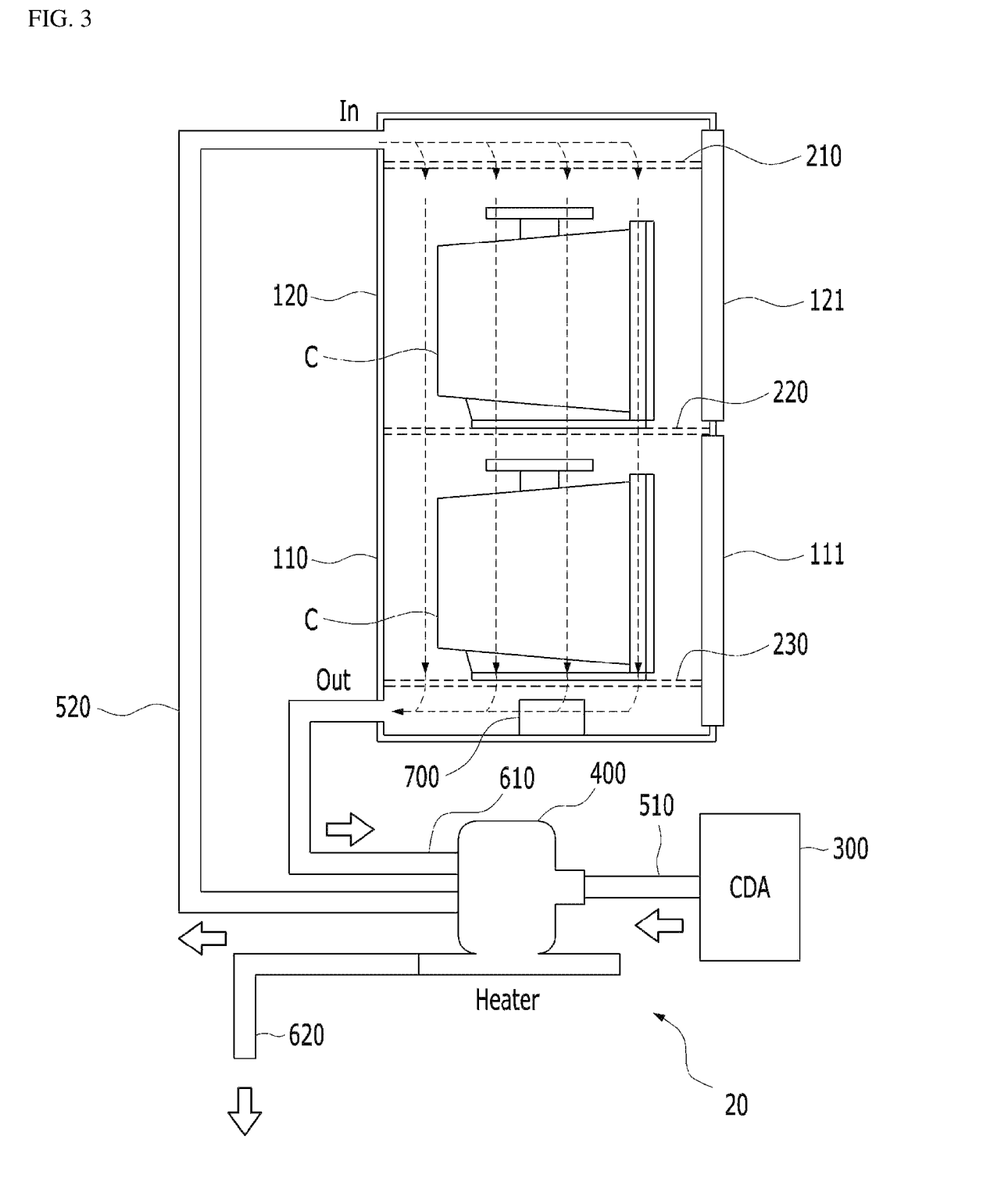
FIG. 3 is an enlarged configuration view of a region A in FIG. 1.
Figure 4:
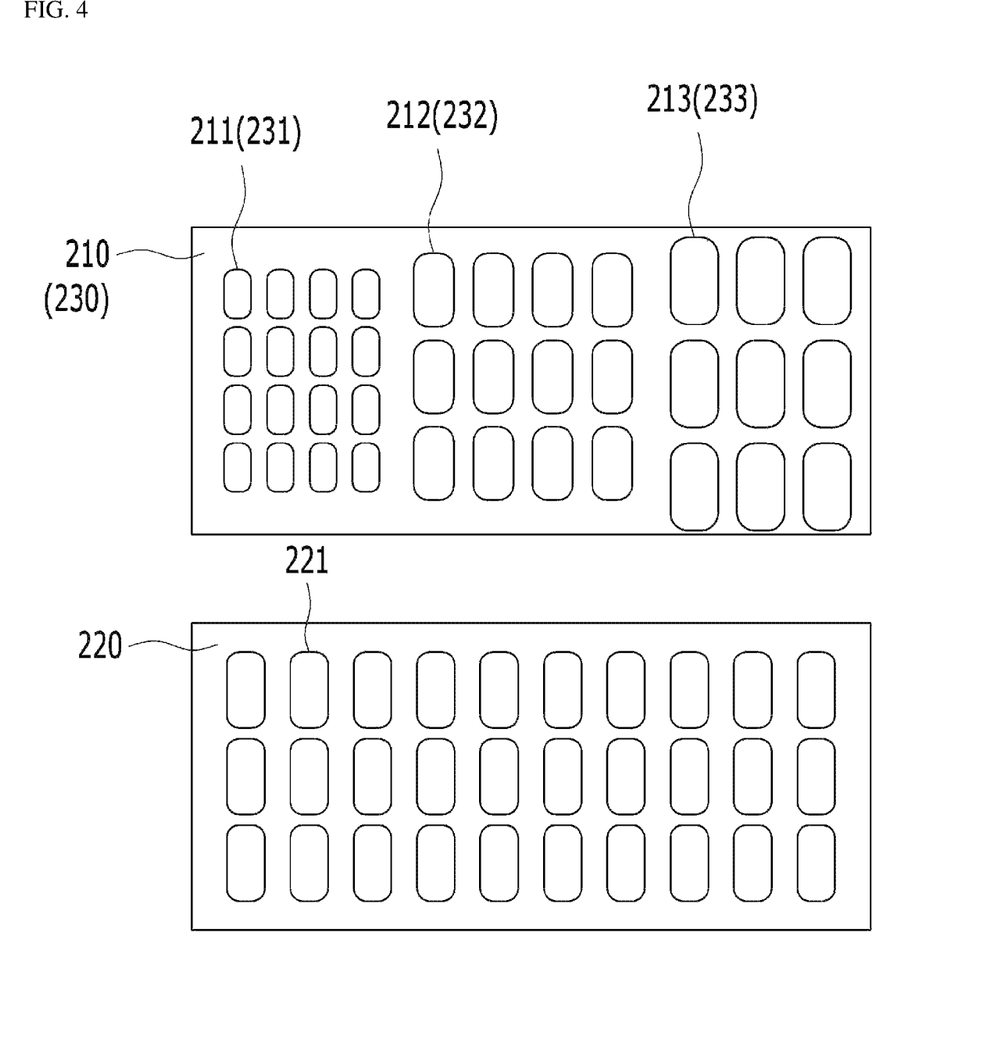
FIG. 4 is a plan view of a horizontal panel in FIG. 3.

FIG. 3 is an enlarged configuration view of the region A in FIG. 1. FIG. 4 is a plan view of a horizontal panel in FIG. 3.

Referring to FIGS. 3 and 4, the wafer cassette stocker 1 of the embodiment may include a humidity controller 20 for supplying compressed dry air CDA to the interiors of the chamber 110 and 120 of the first shelf 101, thereby controlling internal humidity of cassettes C, that is, removing moisture from the cassettes C.

The moisture controller 20 may maintain a suitable environment in the interiors of the cassettes C by removing moisture from the interiors of the chambers 110 and 120. In an embodiment, the moisture controller 20 may perform moisture control while controlling a single module A including the first chamber 110 and the second chamber 120.

A first cassette C may be received in the first chamber 110, and a second cassette C may be received in the second chamber 120.

A central panel 220 formed with a plurality of central through holes 221 may be disposed in the interior of the first shelf 101 in which the first chamber 110 and the second chamber 120 are partitioned. The central panel 220 may support the second cassette C received in the second chamber 120 while allowing the first chamber 110 and the second chamber 120 to communicate with each other.

The humidity controller 20 may simultaneously control internal humidity of the first cassette C and the second cassette C by supplying compressed dry air CDA to the interior of the first shelf 101.

However, in any of the case in which one chamber constitutes one module and the case in which three or more chambers constitute one module, the moisture controller 20 may be varied to simultaneously perform humidity control for a plurality of cassettes C through control of one module.

For example, the moisture controller 20 may include a compressed air generator 300, supply lines 510 and 520, and discharge lines 610 and 620.

The compressed air generator 300 may generate compressed dry air CDA. For example, the compressed air generator 300 may be installed under the module, but the installation position thereof is variable.

The supply lines 510 and 520 may connect the compressed air generator 300 to an upper side of the chambers and, as such, may supply the compressed dry air CDA generated in the compressed air generator 300 to the interiors of the chambers 110 and 120. For example, the supply lines 510 and 520 may be arranged to connect an upper region of the second chamber 120 and the compressed air generator 300.

The discharge lines 610 and 620 may be connected to a lower side of the chambers and, as such, may discharge compressed dry air CDA circulating the interiors of the chambers 110 and 120. For example, the discharge lines 610 and 620 may be arranged to be connected to a lower region of the first chamber 110. One end of the discharge line 610 may be connected to the first chamber 110, and the other end 620 may be exposed to the outside or may be again connected to the compressed air generator 300.

In this case, the supply lines 510 and 520 and the discharge lines 610 and 620 may be installed to be connected to a side surface or a rear surface of the chambers 110 and 120, at which the doors 111 and 121 are not mounted, and, as such, it may be possible to enhance utility of the interiors of the chambers 110 and 120.

As described above, the humidity controller 20 may generate compressed dry air CDA through the compressed air generator 300, and may supply the generated compressed dry air CDA to the interiors of the chambers 110 and 120 via the supply lines 510 and 520. In addition, the compressed dry air CDA, which has circulated the interiors of the chambers 110 and 120, may be discharged to the outside via the discharge lines 610 and 620 or may be transferred to the compressed air generator 300, so as to be reused.

Meanwhile, the humidity controller 20 may further include a heater 400 installed between the supply lines 510 and 520.

The heater 400 may heat compressed dry air CDA generated in the compressed air generator 300, and may then supply the compressed air dry air CDA in a high temperature state to the interiors of the chambers 110 and 120, thereby removing moisture remaining in the cassettes C through evaporation. Thus, moisture may be efficiently removed.

In particular, when cassettes C are inserted into the interiors of the chambers 110 and 120 in the first shelf 101 after a cleaning process, it may be possible to more rapidly remove moisture.

In addition, the moisture controller 20 may further include at least one of a thermometer and a hygrometer installed in a stocker (for example, a module) or a chamber. In the embodiment, a thermo-hygrometer 700, in which a thermometer and a hygrometer are integrated, is illustrated as being installed at a lower side of the first chamber 1110.

The thermo-hygrometer 700 may measure the temperature and humidity of air moving from the second chamber 120 to the first chamber 110, thereby estimating or calculating internal temperatures of the first chamber 110 and the second chamber 120. Of course, the thermometer and the hygrometer may be installed at both the first chamber 110 and the second chamber 120, and the installation positions and the numbers thereof may be variable.

When a thermometer and a hygrometer are included in the humidity controller 20, as described above, it may be possible to check, in real time, a situation in which heated compressed dry air CDA removes moisture in cassettes C while being supplied to the interiors of the chambers 110 and 120. Accordingly, it may be possible to rapidly perform control of temperature, humidity, etc. required for a suitable environment of interiors of the chambers.

Meanwhile, an upper panel 210 may be installed in the interior of the first shelf 101 in order to guide compressed dry air CDA at normal temperature or compressed dry air CDA at a high temperature introduced into the first shelf 101 via the supply lines 510 and 520 to smoothly flow toward a lower side of the cassettes C. The upper panel 210 may be disposed at an upper side of the second chamber 210 within the second chamber 210. A plurality of through holes 211, 212 and 213 may be formed at the upper panel 210 to distribute compressed dry air CDA such that the compressed dry air CDA moves toward the cassettes C.

In addition, a lower panel 230 may be installed in the first shelf 101 in order to guide compressed dry air CDA introduced into the chambers 110 and 120 to smoothly flow to the discharge lines 610 and 620. The lower panel 230 may be disposed at a lower side of the first chamber 110 while supporting the first cassette C. A plurality of through holes 231, 232 and 233 may be formed at the lower panel 230 such that compressed dry air CDA flows therethrough.

In this case, as shown in FIG. 4, the plurality of through holes 211, 212, 213, 231, 232 and 233 formed at the upper panel 210 and the lower panel 230 may have sizes such that areas of the through holes gradually increase with increasing distance from the supply line 510 or the discharge line 610, for distribution of temperature zones. In addition, the central through holes 221 formed at the central panel 220 may have the same size, and may be disposed in plural.

The above-described upper panel 210, central panel 220 and lower panel 230 are horizontally installed and, as such, may be referred to as "horizontal panels". The through holes 211, 212, 213, 231, 232 and 233, and the central through holes 221 may be variable in terms of shape, size and disposition.

Figure 5:
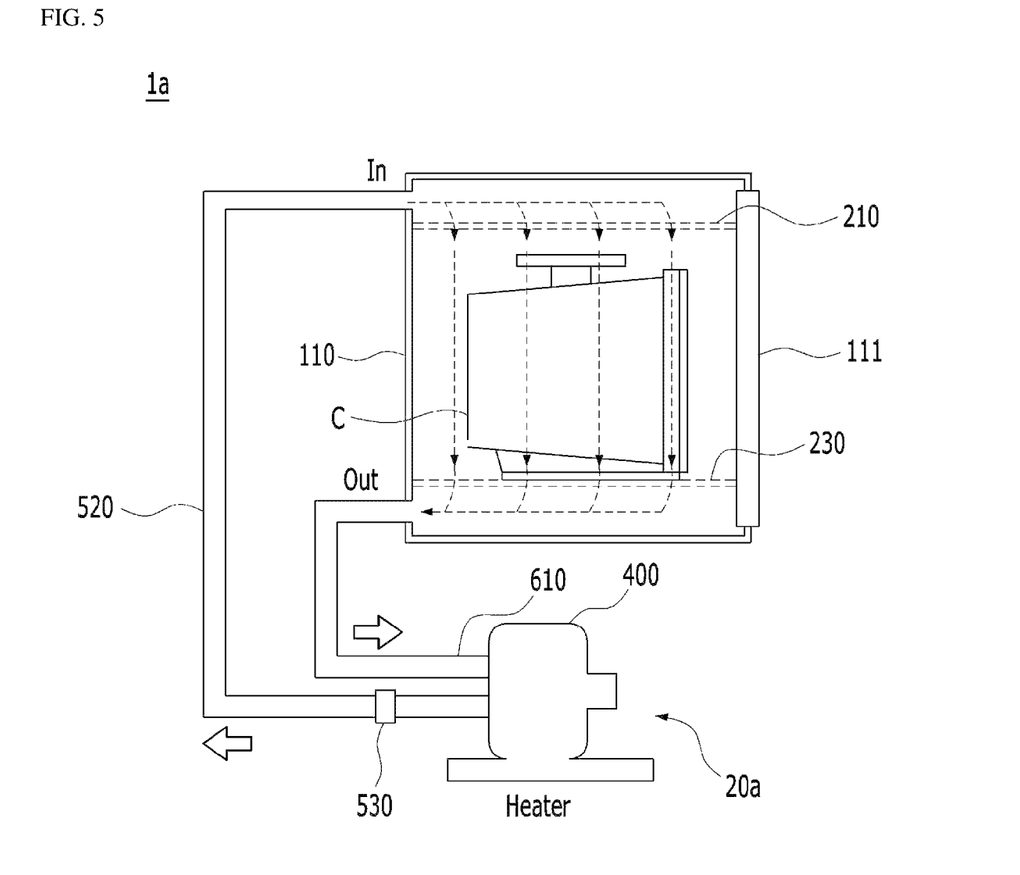
FIG. 5 is an enlarged configuration view of a wafer cassette stocker according to another embodiment.

FIG. 5 is an enlarged configuration view of a wafer cassette stocker according to another embodiment.

The wafer cassette stocker of the other embodiment will be described mainly in conjunction with parts thereof different from those of the wafer cassette stocker 1 of the above-described embodiment.

As shown in FIG. 5, a wafer cassette stocker 1a of the other embodiment has a structure in which one chamber, that is, a first chamber 110, alone constitutes a module. Accordingly, the central panel 220 (FIG. 3) from among the horizontal panels may be omitted, differently from the above-described embodiment.

In addition, the configuration of the above-described thermo-hygrometer 700 (FIG. 3) may be omitted. Furthermore, there may be a configuration in which hot air may move through the discharge line 610 after circulating the interior of the chamber 110 via the supply lines 510 and 520 while passing through the heater 400, without configuration of the compressed air generator 300 (FIG. 3).

In this case, the discharge line 610 may be again connected to the heater 400 such that hot air moving through the discharge line 610 moves through the supply lines 510 and 520 to circulate the interior of the chamber 110. In this case, a filter 530 may further be mounted to the supply lines 510 and 520 in order to filter out foreign matter from circulating hot air.

Of course, the above-described filter 530 applied to this embodiment may also be applicable to the previous embodiment.

As apparent from the above description, in accordance with the wafer cassette stockers of the present invention, hot compressed dry air may remove moisture of a wafer cassette in accordance with supply thereof to the interior of a chamber and, as such, it may be possible to avoid occurrence of a time-dependent haze (TDH) phenomenon, and to maintain a suitable environment in the interior of the cassette.

Hereinafter, a wafer cassette drying method using a wafer cassette stocker according to an embodiment will be described.

Figure 6:
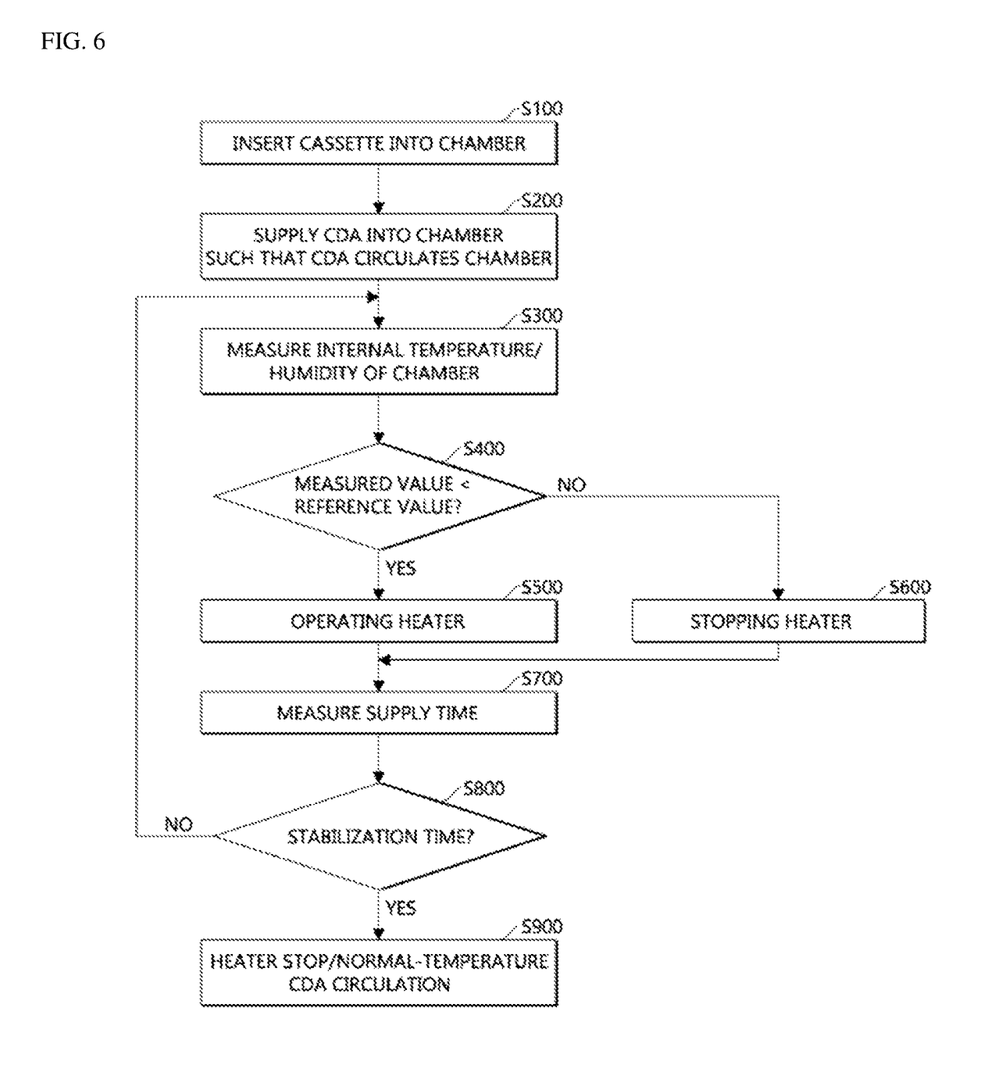
FIG. 6 is a flowchart of a wafer cassette drying method according to an embodiment.

FIG. 6 is a flowchart of a wafer cassette drying method according to an embodiment.

As shown in FIG. 6, a step S100 of inserting a cassette C, which can stack wafers therein, into a chamber is first performed. Step S100 may use the rack master 10 of the above-described wafer cassette stocker 1.

Once cassettes C are inserted into the chambers 110 and 120, respectively, a compressed dry air circulation step is performed (S200). In step S200, operation of supplying compressed dry air CDA to the interiors of the chambers 110 and 120 such that the compressed dry air CDA circulates the cassettes C, and discharging the compressed dry air CDA to the outside of the chambers 110 and 120.

Step S200 may be performed through the compressed air generator 300, the supply lines 510 and 520, and the discharge lines 610 and 620 of the above-described wafer cassette stocker 1.

When supply and circulation of compressed dry air CDA to and in the interiors of the chambers 110 and 120 are carried out, a temperature measurement step of measuring internal temperatures of the chambers 110 and 120 is performed (S300). Step S300 may be performed by the thermo-hygrometer 700 of the above-described wafer cassette stocker 1.

Thereafter, a temperature comparison step of comparing whether or not a measured temperature (a measured value) in the temperature measurement step S300 is lower than a predetermined temperature (a reference value) may be performed (S400).

In this case, when the measured value is lower than the reference value in accordance with results of the temperature comparison step S400, a heater operating step S500 of operating the heater 400 is performed. Supply and circulation of compressed dry air CDA at a high temperature to and in the interiors of the chambers 110 and 120 may be carried out through the heater operating step S500.

Accordingly, in the case in which the cassettes C are inserted into the chambers 110 and 120 in the first shelf 101, respectively, after a cleaning process, moisture may be rapidly removed from the cassettes C and, as such, wafers may be dried.

If the measured value in the temperature comparison step S400 is higher than the reference value, a heater stopping step S600 of stopping operation of the heater is performed and, as such, compressed dry air CDA at normal temperature may be supplied to and circulated in the interiors of the chambers 110 and 120.

After the above-described heater operating step S500 and the above-described heater stopping step S600, a time measurement step of measuring a time for which compressed dry air CDA is supplied to the interiors of the chambers 110 and 120 may be performed (S700).

Subsequently, a stabilization determination step of determining whether or not the time measured in the time measurement step S700 corresponds to a time for which stabilization proceeds in the interiors of the cassettes C is performed (S800). Here, the stabilization time may be a time predetermined as a time taken to achieve stable drying of the cassettes C received in the chambers 110 and 120 through evaporation of moisture of the cassettes C.

If the measured time in the stabilization determination step S800 corresponds to the stabilization proceeding time, the above-described heater stopping step S900 is performed to circulate compressed dry air CDA at normal temperature. On the other hand, when the measured time does not correspond to the stabilization proceeding time, the temperature measurement step S300 may be performed again.

Figure 7:
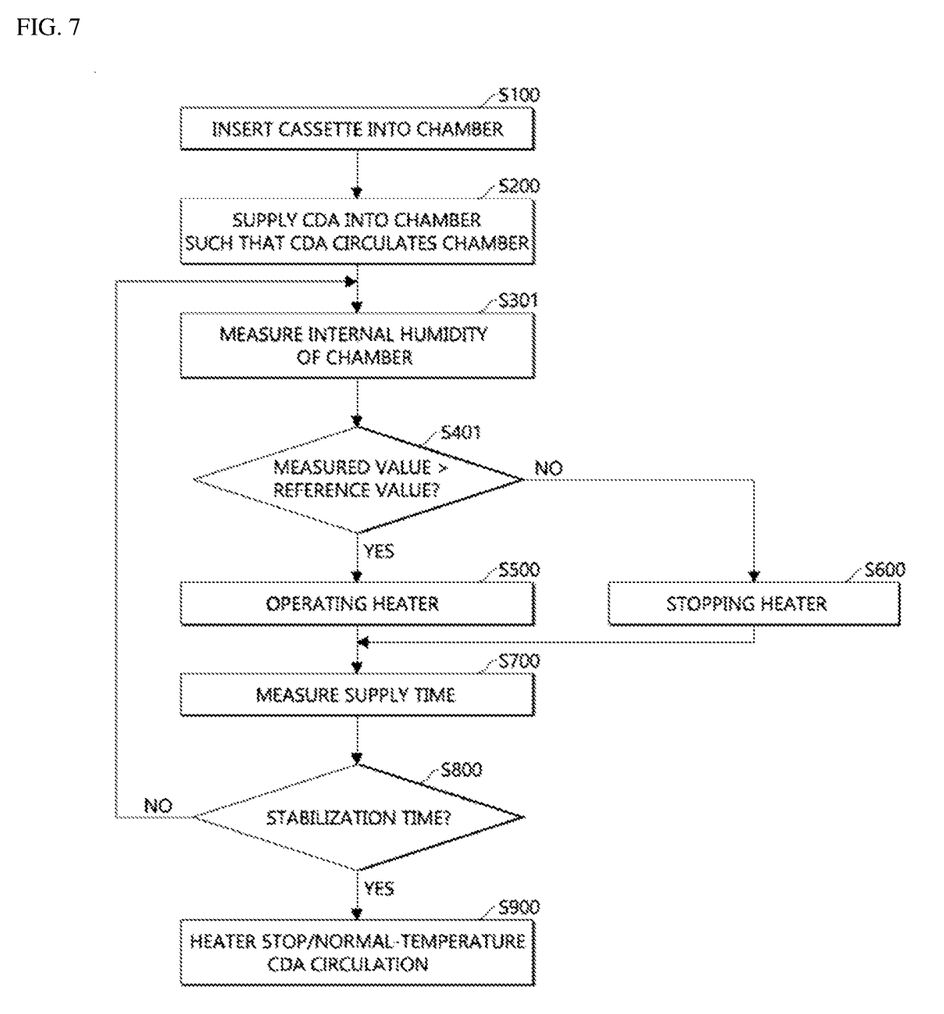
FIG. 7 is a flowchart of a wafer cassette drying method according to another embodiment.

FIG. 7 is a flowchart of a wafer cassette drying method according to another embodiment.

As shown in FIG. 7, in this embodiment, a step S100 of inserting a cassette C, which can stack wafers therein, into a chamber is also first performed. Step S100 may use the rack master 10 of the above-described wafer cassette stocker 1.

Once cassettes C are inserted into the chambers 110 and 120, respectively, a compressed dry air circulation step is performed (S200). In step S200, operation of supplying compressed dry air CDA to the interiors of the chambers 110 and 120 such that the compressed dry air CDA circulates the cassettes C, and discharging the compressed dry air CDA to the outside of the chambers 110 and 120.

Step S200 may be performed through the compressed air generator 300, the supply lines 510 and 520, and the discharge lines 610 and 620 of the above-described wafer cassette stocker 1.

When supply and circulation of compressed dry air CDA to and in the interiors of the chambers 110 and 120 are carried out, a humidity measurement step of measuring internal humidity's of the chambers 110 and 120 is performed (S301). Step S301 may be performed by the thermohygrometer 700 of the above-described wafer cassette stocker 1.

Thereafter, a humidity comparison step of comparing whether or not a measured humidity (a measured value) in the humidity measurement step S301 is higher than a predetermined temperature (a reference value) may be performed (S401).

In this case, when the measured value is higher than the reference value in accordance with results of the humidity comparison step S401, a heater operating step S500 of operating the heater 400 is performed. Supply and circulation of compressed dry air CDA at a high temperature to and in the interiors of the chambers 110 and 120 may be carried out through the heater operating step S500.

Accordingly, in the case in which the cassettes C are inserted into the chambers 110 and 120 in the first shelf 101, respectively, after a cleaning process, moisture may be rapidly removed from the cassettes C and, as such, wafers may be dried.

If the measured value in the moisture comparison step S401 is lower than the reference value, a heater stopping step S600 of stopping operation of the heater is performed and, as such, compressed dry air CDA at normal temperature may be supplied to and circulated in the interiors of the chambers 110 and 120.

After the above-described heater operating step S500 and the above-described heater stopping step S600, a time measurement step of measuring a time for which compressed dry air CDA is supplied to the interiors of the chambers 110 and 120 may be performed (S700).

Subsequently, a stabilization determination step of determining whether or not the time measured in the time measurement step S700 corresponds to a time for which stabilization proceeds in the interiors of the cassettes C is performed (S800). Here, the stabilization time may be a time predetermined as a time taken to achieve stable drying of the cassettes C received in the chambers 110 and 120 through evaporation of moisture of the cassettes C.

If the measured time in the stabilization determination step S800 corresponds to the stabilization proceeding time, the above-described heater stopping step S900 is performed to circulate compressed dry air CDA at normal temperature. On the other hand, when the measured time does not correspond to the stabilization proceeding time, the temperature measurement step S300 may be performed again.

As apparent from the above description, in accordance with the wafer cassette stocker of the present invention and the wafer cassette drying method of the present invention using the same, moisture of a wafer cassette is removed through supply of compressed dry air at a high temperature to the interior of a chamber and, as such, it may be possible to avoid occurrence of a time-dependent haze (TDH) phenomenon, and to maintain a suitable environment in the interior of the cassette.

Characteristics, structures, effects, and so on described in above embodiments are included in at least one of the embodiments, but are not limited to only one embodiment invariably. Furthermore, it is apparent that the features, the structures, the effects, and so on described in the embodiments can be combined or modified with other embodiments by persons skilled in this field of art. Therefore, it should be understood that the contents relevant to such combination and modification fall within the scope of the present invention.

INDUSTRIAL APPLICABILITY

The wafer cassette stocker of the embodiment may be used in a wafer manufacturing device, a semiconductor manufacturing device, etc.

The invention claimed is:
1. A wafer cassette stocker comprising:
cassettes each capable of stocking a plurality of wafers therein;
a plurality of chambers disposed in a line while forming at least one story, the chambers receiving the cassettes therein after cleaning of the cassettes; and a humidity controller for supplying compressed dry air (CDA) to interiors of the chambers, thereby controlling humidity of the cassettes, wherein the humidity controller includes a compressed air generator configured to generate the compressed dry air, supply lines configured to connect the compressed air generator to an upper side of the chambers, a discharge line connected to a lower side of the chambers, and a thermo-hygrometer, in which a thermometer and a hygrometer are integrated, is installed at a lower side of at least one of the chambers, and wherein a filter is mounted to at least one of the supply lines.

2. The wafer cassette stocker according to claim 1, wherein the humidity controller includes:

a heater installed between two of the supply lines.

3. The wafer cassette stocker according to claim 1, wherein the humidity controller includes:

an upper panel formed with a plurality of through holes to guide compressed dry air introduced therein from the supply lines to flow toward a lower side of the cassettes, and the upper panel being disposed at an inner upper side of the chambers.

4. The wafer cassette stocker according to claim 3, wherein the humidity controller includes:

a lower panel formed with a plurality of through holes to guide the compressed dry air to flow toward the discharge line, the lower panel being disposed at an inner lower side of the chambers to support the cassettes.

5. The wafer cassette stocker according to claim 4, wherein the plurality of through holes formed at the upper panel are disposed to have sizes such that areas of the through holes gradually increase with increasing distance from one of the supply lines, and the plurality of through holes formed at the lower panel are disposed to have sizes such that areas of the through holes gradually increase with increasing distance from the discharge line.

6. A wafer cassette stocker comprising:

a stocker that includes a first chamber, and a second chamber disposed over the first chamber;

a first cassette received in the first chamber;

a second cassette received in the second chamber;

a central panel installed within the stocker to partition the first chamber and the second chamber while supporting the second cassette, and the central panel being formed with a plurality of central through holes; and a humidity controller configured to provide compressed dry air to an interior of the stocker, thereby removing moisture of the first cassette and the second cassette, wherein the humidity controller includes a compressed air generator configured to generate the compressed dry air, supply lines to connect the compressed air generator to an upper side of the second chamber, a discharge line to connect to a lower side of the first chamber, a heater installed between two of the supply lines, and a thermo-hygrometer, in which a thermometer and a hygrometer are integrated, installed at a lower side of at least one of the chambers, and wherein a filter is mounted to at least one of the supply lines.

7. The wafer cassette stocker according to claim 6, wherein the humidity controller includes:

an upper panel formed with a plurality of through holes to guide compressed dry air introduced therein from the supply lines to flow therethrough, the upper panel being disposed at an inner upper side of the second chamber; and a lower panel formed with a plurality of through holes to guide the compressed dry air to flow toward the discharge line, the lower panel being disposed at an inner lower side of the first chamber to support the first cassette.

8. The wafer cassette stocker according to claim 7, wherein the plurality of through holes formed at the upper panel are disposed to have sizes such that areas of the through holes gradually increase with increasing distance from one of the supply lines, and the plurality of through holes formed at the lower panel are disposed to have sizes such that areas of the through holes gradually increase with increasing distance from the discharge line.

9. The wafer cassette stocker according to claim 6, wherein the central through holes formed at the central panel are configured to have a same size.

* * * * *